United States Patent
Wang

(10) Patent No.: US 7,760,580 B2
(45) Date of Patent: Jul. 20, 2010

(54) FLASH MEMORY DEVICE AND ERASE METHOD USING THE SAME

(75) Inventor: Jong Hyun Wang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 59 days.

(21) Appl. No.: 11/617,307

(22) Filed: Dec. 28, 2006

(65) Prior Publication Data

US 2008/0080242 A1    Apr. 3, 2008

(30) Foreign Application Priority Data

Sep. 29, 2006    (KR) ...................... 10-2006-0096186

(51) Int. Cl.
*G11C 8/00* (2006.01)

(52) U.S. Cl. ........................... 365/230.06; 365/230.01; 365/230.03; 365/233.1; 365/233.5

(58) Field of Classification Search ............ 365/230.06, 365/230.01, 230.03, 233.1, 233.5
See application file for complete search history.

(56) References Cited

U.S. PATENT DOCUMENTS

| | | | | |
|---|---|---|---|---|
| 5,280,447 A | * | 1/1994 | Hazen et al. ............ | 365/185.11 |
| 5,339,279 A | * | 8/1994 | Toms et al. ............. | 365/185.11 |
| 5,355,342 A | * | 10/1994 | Ueoka ........................ | 365/201 |
| 5,444,664 A | * | 8/1995 | Kuroda et al. ................ | 365/226 |
| 5,548,557 A | * | 8/1996 | Futatsuya et al. ........... | 365/201 |
| 5,553,026 A | * | 9/1996 | Nakai et al. .................. | 365/201 |
| 5,602,778 A | * | 2/1997 | Futatsuya et al. ...... | 365/185.09 |
| 5,689,463 A | * | 11/1997 | Murakami et al. .......... | 365/200 |
| 5,805,510 A | * | 9/1998 | Miyakawa et al. ..... | 365/185.11 |
| 5,847,999 A | * | 12/1998 | Kwon ..................... | 365/185.33 |
| 5,898,637 A | * | 4/1999 | Lakhani et al. ........ | 365/230.06 |
| 6,178,127 B1 | * | 1/2001 | Haraguchi .................. | 365/200 |
| 6,288,940 B1 | * | 9/2001 | Kawamura ............. | 365/185.09 |
| 6,373,770 B1 | * | 4/2002 | Kwon ...................... | 365/225.7 |
| 6,377,486 B1 | * | 4/2002 | Lee ........................ | 365/185.11 |
| 6,397,313 B1 | * | 5/2002 | Kasa et al. ................... | 711/168 |
| 6,414,874 B2 | | 7/2002 | Akaogi | |
| 6,462,985 B2 | * | 10/2002 | Hosono et al. ......... | 365/185.09 |
| 6,496,413 B2 | * | 12/2002 | Taura et al. ............ | 365/185.09 |
| 6,512,692 B2 | * | 1/2003 | Yamauchi et al. ...... | 365/185.11 |

(Continued)

FOREIGN PATENT DOCUMENTS

EP    1 594 139 A1    11/2005

(Continued)

*Primary Examiner*—Viet Q Nguyen
(74) *Attorney, Agent, or Firm*—Townsend and Townsend and Crew LLP

(57) ABSTRACT

A flash memory device includes a plurality of block selection circuits and a plurality of memory blocks. The plurality of block selection circuits generate a block select signal in response to a plurality of decoded block address signals and a block control signal. The plurality of memory blocks are connected to global lines in response to the block select signal, and include a plurality of memory cell arrays performing an erase operation in response to a well bias. Each of the block selection circuits generates the block select signal in response to the block control signal regardless of the plurality of decoded block address signals, or selects the block select signal to select a corresponding memory block in response to the plurality of decoded block address signals.

7 Claims, 2 Drawing Sheets

U.S. PATENT DOCUMENTS

| | | | |
|---|---|---|---|
| 6,611,460 B2 * | 8/2003 | Lee et al. | 365/185.18 |
| 6,760,259 B1 * | 7/2004 | Futatsuya et al. | 365/185.33 |
| 6,768,671 B1 * | 7/2004 | Lee et al. | 365/185.02 |
| 6,956,769 B2 * | 10/2005 | Lee | 365/185.09 |
| 7,102,927 B2 * | 9/2006 | Jo | 365/185.12 |
| 7,110,301 B2 * | 9/2006 | Lee et al. | 365/185.29 |
| 7,313,022 B2 * | 12/2007 | Takeuchi et al. | 365/185.09 |
| 7,362,614 B2 * | 4/2008 | Sakui et al. | 365/185.17 |
| 7,369,454 B2 * | 5/2008 | Shiga | 365/230.06 |
| 7,495,957 B2 * | 2/2009 | Futatsuyama | 365/185.11 |
| 2003/0117886 A1 | 6/2003 | Shiga et al. | |
| 2004/0090847 A1 * | 5/2004 | Takeuchi et al. | 365/200 |
| 2004/0240254 A1 * | 12/2004 | Shiga et al. | 365/154 |
| 2008/0165575 A1 * | 7/2008 | Cho et al. | 365/163 |

FOREIGN PATENT DOCUMENTS

| | | |
|---|---|---|
| JP | 2003-257190 | 9/2003 |
| JP | 2005-339763 | 12/2005 |
| KR | 1019970072440 | 11/1997 |
| KR | 1020010037587 A | 5/2001 |
| KR | 1020060024146 A | 3/2006 |
| KR | 1020060110197 A | 10/2006 |

* cited by examiner

1

FLASH MEMORY DEVICE AND ERASE METHOD USING THE SAME

CROSS-REFERENCES TO RELATED APPLICATIONS

The present application claims priority to Korean patent application number 10-2006-96186, filed on Sep. 29, 2006, which is incorporated by reference in its entirety.

BACKGROUND OF THE INVENTION

The present invention relates, in general, to flash memory devices and, more particularly, to a flash memory device and an erase method using the same, in which a plurality of blocks are erased at the same time, shortening an erase time.

In general, a NAND flash memory device includes a plurality of cell blocks. One cell block includes a plurality of cell strings in which a plurality of cells are connected in series, a plurality of bit lines, a plurality of word lines, a drain select transistor connected between the cell strings and the bit lines, and a source select transistor connected between the cell strings and a common source line.

Meanwhile, the plurality of memory cells sharing one word line constitutes one page. The entire cells share a P well. The NAND flash memory device further includes a pass transistor for applying a specific voltage to the cell blocks. The pass transistor includes a high voltage transistor for drain selection, a high voltage transistor for source selection, and a high voltage transistor for cell selection.

In the NAND flash memory device constructed above, in order to program data into a memory cell, erasure is performed, and a program operation is then performed on only a selected group of cells. In this case, the program operation of the NAND flash memory device is performed on a page basis, but the erase operation thereof is performed on a cell-block basis since the entire cells share the P well. An erase method of the conventional NAND flash memory device is described below in short.

After any one of the plurality of cell blocks is selected, a power supply voltage is applied to a gate terminal of each of a high voltage transistor for drain selection, a high voltage transistor for source selection, and a high voltage transistor for cell selection within a pass transistor connected to the selected cell block. A voltage of 4.5 V is applied to a drain select transistor and a source select transistor through the high voltage transistor for drain selection and the high voltage transistor for source selection, and a voltage of 0 V is applied to a memory cell through the high voltage transistor for cell selection.

Further, a voltage of 0 V is applied to a gate terminal of each of a high voltage transistor for drain selection, a high voltage transistor for source selection, and a high voltage transistor for cell selection within a pass transistor connected to an unselected cell block. An erase voltage is applied to P wells of the entire cell blocks. However, in P wells of an unselected cell, when the erase voltage rises, a word line voltage of an unselected cell block rises due to the coupling effect incurred by capacitance of the word lines and capacitance between the word lines and the P well. Accordingly, the unselected cell block is not erased.

FIG. 1 is a circuit diagram of a block switch circuit of a conventional flash memory device.

Referring to FIG. 1, a block selection circuit 10 outputs a block select signal (Bsel) in response to a plurality of decoded block addresses BA0 to BAi, and selects a memory block.

At the time of an erase operation, the flash memory device performs the erase operation by individually specifying a block address on which the erase operation will be performed. Due to this, a memory controller has to designate a block address for every block, and an erase time increases in proportion to the number of blocks designated.

BRIEF SUMMARY OF THE INVENTION

The present invention is directed to a flash memory device and an erase method using the same, in which a block switch circuit of the flash memory device is controlled to erase a plurality of desired memory blocks at the same time or sequentially in response to a control signal intuitively enabled according to a decoded block address and a selected block address, thus shortening an erase time of the device.

In one embodiment of the present invention, a flash memory device includes a plurality of block selection circuits and a plurality of memory blocks. The plurality of block selection circuits generate a block select signal in response to a plurality of decoded block address signals and a block control signal. The plurality of memory blocks are connected to global lines in response to the block select signal, and include a plurality of memory cell arrays performing an erase operation in response to a well bias. Each of the block selection circuits generates the block select signal in response to the block control signal regardless of the plurality of decoded block address signals, or selects the block select signal to select a corresponding memory block in response to the plurality of decoded block address signals.

In another embodiment of the present invention, an erase method of a flash memory device includes selecting a start memory block and an end memory block on which an erase operation will be performed, from a plurality of memory blocks; sequentially enabling block selection circuits respectively connected from the start memory block to the end memory block; and sequentially erasing the memory blocks by applying an erase bias to wells of the start memory block to the end memory block.

In still another embodiment of the present invention, an erase method of a flash memory device includes selecting one or more memory blocks on which an erase operation will be performed, from a plurality of memory blocks; simultaneously enabling block selection circuits corresponding to the selected one or more memory blocks; and simultaneously erasing a plurality of memory blocks by applying an erase bias to the selected one or more memory blocks.

DESCRIPTION OF SPECIFIC EMBODIMENTS

Embodiments according to the present invention will be described with reference to the accompanying drawings.

Figure 1:
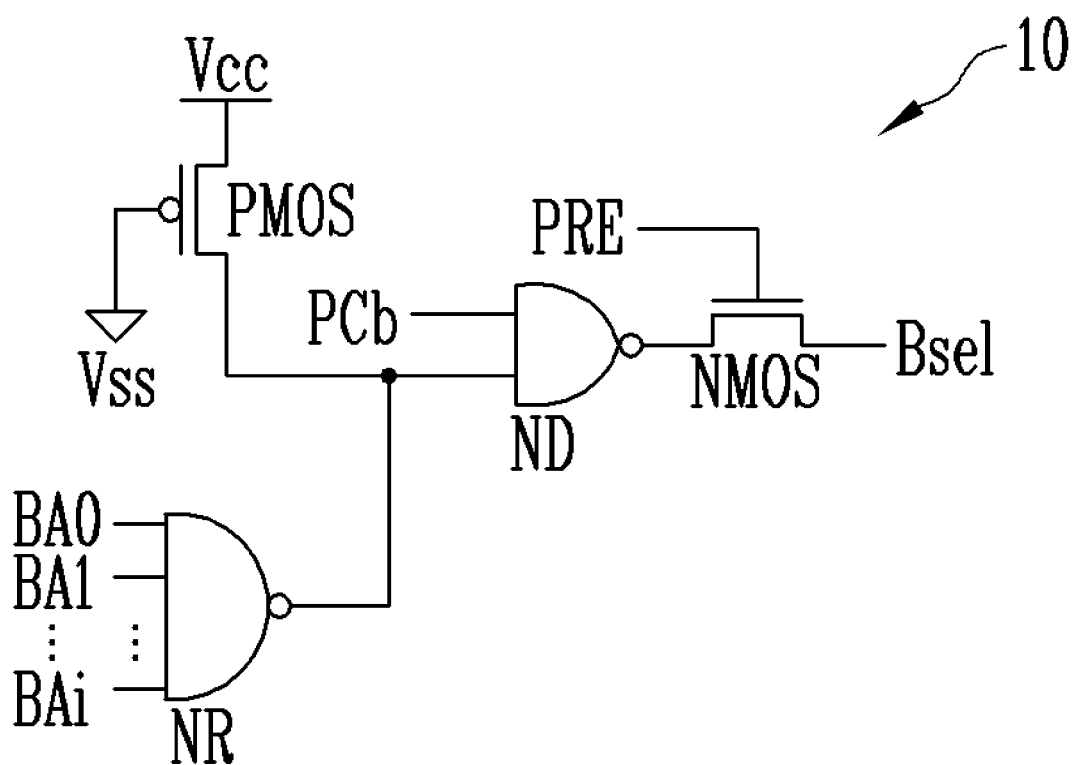
FIG. 1 is a circuit diagram of a block switch circuit of a conventional flash memory device.
Figure 2:
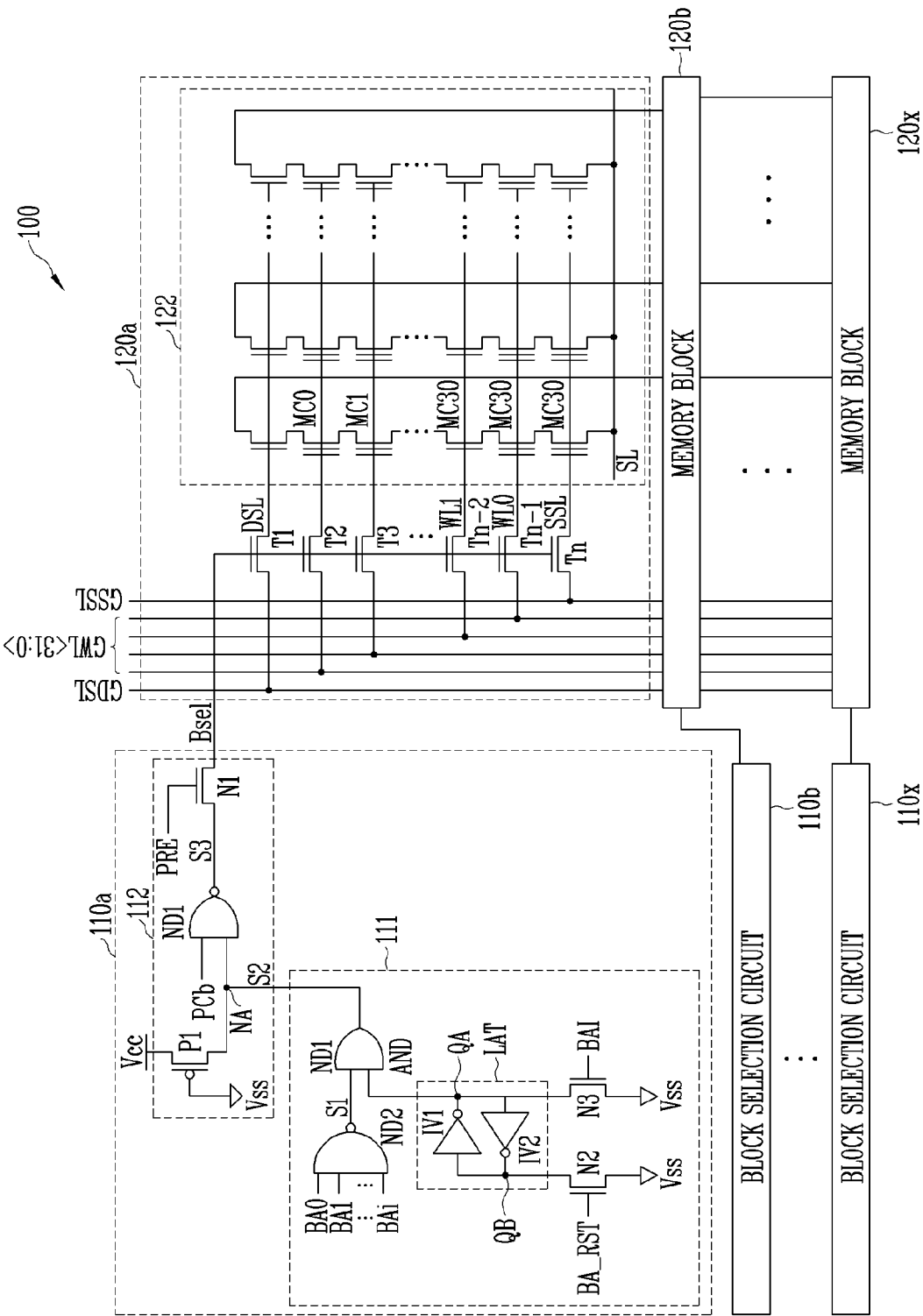
FIG. 2 is a circuit diagram of a flash memory device including a block switch circuit according to an embodiment of the present invention.

FIG. 2 is a circuit diagram of a flash memory device including a block switch circuit according to an embodiment of the present invention.

Referring to FIG. 2, a flash memory device 100 includes a plurality of block selection circuits 110a to 110x (where "a" to "x" are positive integers), and a plurality of memory blocks 120a to 120x (where "a" to "x" are positive integers). The plurality of block selection circuits 110a to 110x are connected to the plurality of memory blocks 120a to 120x, respectively.

The plurality of block selection circuits 110a to 110x have similar construction and operations. Thus, only the block selection circuit 110a is described as an example.

The block selection circuit 110a includes a control signal generator 111 and a select signal generator 112.

The control signal generator 111 generates a select control signal S2 in response to a plurality of decoded block address signals BA0 to BAi and a block control signal BAI.

The control signal generator 111 includes a NAND gate ND2, an AND gate AND, a latch LAT, and NMOS transistors N2 and N3. The NAND gate ND2 performs a NAND operation on the plurality of decoded block address signals BA0 to BAi, and outputs a combination signal S1. The AND gate AND performs an AND operation on the combination signal S1 and a signal of a node QA of the latch LAT, and generates the select control signal S2. The latch LAT includes inverters IV1 and IV2 connected in an inverse direction parallel structure. The NMOS transistor N2 is connected to a node QB of the latch LAT and a ground voltage Vss, and connects the node QB and the ground voltage Vss in response to a resetting signal BA_RST. The NMOS transistor N3 is connected to the node QA of the latch LAT and the ground voltage Vss, and connects the node QA and the ground voltage Vss in response to the block control signal BAI.

The select signal generator 112 includes a NAND gate ND1, a PMOS transistor P1, and a NMOS transistor N1. The PMOS transistor P1 is connected between a power supply voltage Vcc and a node NA. The PMOS transistor P1 has a gate connected to the ground voltage Vss, and supplies the power supply voltage Vcc to the node NA. The PMOS transistor P1 has a resistance value, and serves as a resistor. The NAND gate ND1 performs a NAND operation on a program precharge bar signal PCb, which is applied as a logic high level (e.g., a voltage of Vcc) at the time of an erase operation, and the select control signal S2, and generates a combination signal S3. The NMOS transistor N1 is connected to an output terminal of the NAND gate ND1, and outputs the combination signal S3 as a block select signal Bsel in response to a precharge signal PRE. At this time, the precharge signal PRE is a logic high voltage signal having a voltage of Vcc+Vth.

The plurality of memory blocks 120a to 120x have similar constructions and operations. Thus, only the memory block 120a is described as an example.

The memory block 120a includes a pass transistor unit 121 and a memory cell array unit 122.

The pass transistor unit 121 includes a plurality of pass transistors T1 to Tn. The plurality of pass transistors T1 to Tn are turned on in response to the block select signal Bsel, and connect a global drain select line GDSL and a drain select line, global word lines GWL<31:0> and word lines, and a global source select line GSSL and a source line, respectively.

The memory cell array unit 122 includes a plurality of cell arrays respectively having a string structure in which a plurality of memory cells MC0 to MC31, a drain select transistor and a source select transistor are connected in series.

An erase operation of the flash memory device according to an embodiment of the present invention is described in detail below with reference to FIG. 2.

The range of memory blocks on which an erase operation will be performed is set in order to specify a start block address and an end block address at the time of an instruction setting operation of the erase operation. Furthermore, for the purpose of an individual erase operation, a block address selected from a plurality of block addresses is specified. The block control signal BAI corresponding the start block address and the end block address of the plurality of block addresses, or the select block address is generated by a block address scan circuit (not shown). In some embodiments of the present invention, the block address scan circuit can be implemented using a general counter.

In one embodiment of the present invention, an example is described in which the erase start block is set to the memory block 120a, and the end block is set to the memory block 120x.

The resetting signal BA_RST is applied to the NMOS transistor N2 of the control signal generator 111, so that the node QB of the latch LAT and the ground voltage Vss are connected. Accordingly, the node QA is reset to a logic high level. Thereafter, the block control signal BAI shifts from a logic low level to a logic high level, so that the NMOS transistor N3 of the control signal generator 111 is turned on. Thus, the node QA of the latch LAT shifts to a logic low level (e.g., to ground voltage Vss).

The NAND gate ND2 performs a NAND operation on the plurality of decoded block address signals BA0 to BAi, and outputs the combination signal S1 of a low level. The AND gate AND performs a AND operation on the signal of a logic low level, of the node QA, and the combination signal S1 of a logic low level, and generates the select control signal S2 of a logic low level.

The node NA of the select signal generator 112, the power supply voltage Vcc supplied from the PMOS transistor P1 is discharged to a logic low level by the select control signal S2 of the control signal generator 111. At this time, the PMOS transistor P1 has a resistance value, and the node NA is stabilized to a logic low level. The NAND gate ND1 performs a NAND operation on the select control signal S2 of a logic low level and the program precharge bar signal PCb, which shifts to a logic high level at the time of the erase operation, and outputs the combination signal S3 of a logic high level. The NMOS transistor N1 is turned on in response to the precharge signal PRE of a logic high level Vcc+Vth, and outputs the combination signal S3 of a logic high level to the block select signal Bsel.

The block select signal Bsel activates the pass transistor unit 121 of the memory block 120a. In other words, the plurality of pass transistors T1 to Tn are turned on in response to the block select signal Bsel, and thus connect the global drain select line GDSL and the drain select line, the global word lines GWL<31:0> and the word lines, and the global source select line GSSL and the source line, respectively. At this time, in a state where a well bias of about 20 V is applied to the well of the memory block 120a as a logic high voltage, the erase operation is performed on the memory block 120a.

Thereafter, the block control signal BAI applied to the block selection circuit 110b is enabled by means of the block address scan circuit, so that the erase operation of the memory block 120b is carried out as described above. This process is sequentially performed until the erase operation of the end memory block 120x is completed.

In the case where the erase operation of the plurality of memory blocks is performed at the same time, the erase operation can be performed at the same time by enabling the block control signal BAI corresponding to the address of a corresponding memory block.

As described above, according to embodiments of the present invention, a block switch circuit of a flash memory device is controlled to erase a plurality of desired memory blocks at the same time or sequentially in response to a control signal intuitively enabled according to a decoded block address and a selected block address. Accordingly, an erase time of the device ca be shortened.

The above embodiments of the present invention are illustrative and not limitative. Various alternatives and equivalents are possible. Other additions, subtractions, or modifications are possible in view of the present disclosure and are intended to fall within the scope of the appended claims.

What is claimed is:

1. A flash memory device, comprising:
    a memory block;
    a block selection circuit for generating a block select signal in response to a plurality of decoded block address signals and selecting the memory block in response to the block select signal; and
    a control unit for selecting the memory block in response to a block control signal without regard to the plurality of decoded block address signals,
    wherein the block control signal is enabled in response to a selected block address signal of the plurality block address signals.

2. The flash memory device of claim 1, wherein the block selection circuit comprises:
    a control signal generator for generating a select control signal in response to the plurality of decoded block address signals; and
    a select signal generator for generating the block select signal in response to the select control signal.

3. The flash memory device of claim 2, wherein the control signal generator comprises:
    a NAND gate for logically combining the plurality of decoded block address signals to generate a combination signal; and
    an AND gate for outputting the select control signal by logically combining the combination signal and a control signal.

4. The flash memory device of claim 2, wherein the select signal generator comprises:
    a NAND gate to logically combine the select control signal and a program precharge bar signal, and generate a combination signal; and
    a transistor to output the combination signal as the block select signal in response to a precharge signal.

5. The flash memory device of claim 1, wherein the block control signal is enabled in response to a start address and an end address of the selected block address signal.

6. The flash memory device of claim 5, further comprising a block address scan circuit having a counter to generate the block control signal in response to the start address and the end address.

7. The flash memory device of claim 3, wherein the control unit comprises:
    a latch for temporarily storing a control signal in response to the block control signal and for outputting the control signal to an output node of the latch; and
    a transistor connected to the output node of the latch and a ground voltage, and configured to control an output node voltage of the latch in response to the block control signal.

* * * * *